(12) United States Patent  
Corcos et al.

(10) Patent No.: US 8,957,378 B2
(45) Date of Patent: Feb. 17, 2015

(54) NANO-TIP SPACERS FOR PRECISE GAP CONTROL AND THERMAL ISOLATION IN MEMS STRUCTURES

(75) Inventors: Dan Corcos, Nesher (IL); Michel Despont, Au (CH); Danny Elad, Moshav Liman (IL); Bernd Gotsmann, Horgen (CH); Lukas Kull, Zurich (CH); Thomas E. Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 13/525,397

(22) Filed: Jun. 18, 2012

(65) Prior Publication Data

US 2013/0082181 A1    Apr. 4, 2013

Related U.S. Application Data

(63) Continuation-in-part of application No. 13/251,255, filed on Oct. 2, 2011.

(51) Int. Cl.
 *G01J 5/02* (2006.01)
 *G01J 5/34* (2006.01)
 *G01J 5/08* (2006.01)
 *G01J 5/22* (2006.01)
 *B81B 3/00* (2006.01)

(52) U.S. Cl.
 CPC .............. *G01J 5/34* (2013.01); *G01J 5/0235* (2013.01); *G01J 5/024* (2013.01); *G01J 5/0837* (2013.01); *G01J 5/22* (2013.01); *B81B 3/0081* (2013.01)
 USPC ...................................................... 250/341.1

(58) Field of Classification Search
 USPC ...................................................... 250/341.1
 See application file for complete search history.

(56) References Cited

U.S. PATENT DOCUMENTS

| 6,329,655 | B1 | 12/2001 | Jack et al. |
| 6,441,368 | B1 | 8/2002 | Grinberg et al. |
| 6,586,831 | B2 | 7/2003 | Gooch et al. |
| 7,078,695 | B2 | 7/2006 | Luukanen |
| 7,375,333 | B1 | 5/2008 | Bluzer et al. |
| 7,501,626 | B2 | 3/2009 | Wood et al. |
| 7,557,349 | B2 | 7/2009 | Oda et al. |
| 7,659,859 | B2 | 2/2010 | Bisiules et al. |

(Continued)

FOREIGN PATENT DOCUMENTS

| WO | 2011048170 | 4/2011 |
| WO | 2011151756 | 12/2011 |

OTHER PUBLICATIONS

Gotsmann et al., "Nanoscale thermal and mechanical interactions studies using heatable probes," in Nanotechnology, vol. 6: Nanoprobes, H. Fuchs, Ed. Weinheim, 2009, pp. 121-169.

(Continued)

*Primary Examiner* — David Porta
*Assistant Examiner* — Mindy Vu (57) ABSTRACT

A THz radiation detector comprising a vertical antenna separated from a suspended platform by an isolating thermal air gap for concentrating THz radiation energy into a smaller suspended MEMS platform upon which a thermal sensor element is located. THz photon energy is converted into electrical energy via a thermally isolated air gap between plates of a coupling capacitor separated by a plurality of nano-tip spacers that determine the gap distance. The capacitor couples energy from the antenna to the thermal sensor.

24 Claims, 7 Drawing Sheets

(56) References Cited

U.S. PATENT DOCUMENTS

| | | | |
|---|---|---|---|
| 7,898,498 | B2 | 3/2011 | Higashi et al. |
| 8,078,128 | B2 | 12/2011 | Floyd |
| 2007/0278407 | A1 | 12/2007 | Wood et al. |
| 2009/0015491 | A1* | 1/2009 | Ikeda et al. ............... 343/703 |
| 2009/0114822 | A1 | 5/2009 | Cox et al. |
| 2009/0154872 | A1 | 6/2009 | Sherrer et al. |
| 2011/0057107 | A1 | 3/2011 | Agnese et al. |
| 2011/0062329 | A1 | 3/2011 | Ben-Bassat |
| 2011/0228809 | A1 | 9/2011 | Tadigadapa |

OTHER PUBLICATIONS

Dunckle et al., "Temperature dependence of single-asperity friction for a diamond on diamondlike carbon interface," Journal of Applied Physics, vol. 107, Issue 11, pp. 114903-114903-6, Jun. 2010.

Shi et al., "Thermal Transport Mechanisms at Nanoscale Point Contacts," Journal of Heat Transfer, vol. 124, pp. 329-337, Apr. 2002.

Faheem et al.,"Post-enabled flip-chip assembly for manufacturable RF-MEMS", Transducers, Solid-State Sensors,12th International Conference on Actuators and Microsystems, vol. 1, pp. 829-832, 2003.

* cited by examiner

NANO-TIP SPACERS FOR PRECISE GAP CONTROL AND THERMAL ISOLATION IN MEMS STRUCTURES

REFERENCE TO PRIORITY APPLICATION

This application is a continuation in part of U.S. application Ser. No. 13/251,255, filed Oct. 2, 2011, entitled "Hybrid THz Imaging Detector With Vertical Antenna And Sub-Pixel Suspended MEMS Thermal Sensor And Actuator," incorporated herein by reference in its entirety.

FIELD OF THE INVENTION

The present invention relates to the field of semiconductor imaging devices, and more particularly relates to nano-tip spacers for precise gap control and thermal isolation in Microelectromechanical Systems (MEMS) structures.

BACKGROUND OF THE INVENTION

Bolometers are frequently used as detectors in the infrared or THz frequency range. One type of bolometer is the antenna coupled bolometer in which the radiation is received by an antenna and heat is generated in a termination resistor. The resulting changes in temperature represent the signal. Pixels made of antennas coupled to thermal sensors are used for imaging devices working in the Far Infra-Red (FIR) or at longer wavelengths. Efficient coupling, however, is required to preserve a good thermal isolation (namely, high thermal resistivity) and at the same time minimize signal loss between the antenna and the sensor. An active area of research effort is the development of uncooled THz sensors considering the big impact they are expected to have once available in the fields of security, spectroscopy and medical imaging. Thus, there is a need for a coupling mechanism between the antenna and sensor. The coupling mechanism should preferably have a high coupling efficiency and fast response time.

SUMMARY OF THE INVENTION

A THz radiation detector comprising a plurality of antenna arms separated from a MEMS hybrid focal plane array (FPA) THz detector with an antenna and sub-pixel suspended Microelectromechanical Systems (MEMS) based thermal sensor. One possible coupling mechanism between antenna and sensor is through a capacitor. A large capacitance is achieved providing a very high coupling efficiency. The geometrical size of the capacitors, however, is minimized to maintain a fast response time.

The THz radiation detector assembly comprises a plurality of antenna arms separated from a suspended platform by an air gap for achieving thermal isolation. The detector functions to concentrate THz radiation energy into the smaller suspended MEMS platform (e.g., membrane) upon which a thermal sensor element is located. In one embodiment, the THz photon energy is converted into electrical energy by means of a pixilated antenna using capacitive coupling in order to couple this focused energy across the thermally isolated air gap and onto the suspended membrane on which the thermal sensor is located. The capacitor is formed from two plates separated by one or more nano-tip spacers which determine the gap between the plates and provide thermal isolation. In another embodiment, the THz photon energy is electrically coupled from the antenna to the sensor via electrically conductive nano-tip spacers rather than through a capacitor. The nano-tip spacers also function to provide thermal insulation between the antenna and sensor.

The detector mechanism achieves a much stronger, focused THz induced thermal heating of the suspended membrane such that this thermal signal becomes much stronger than the detector temperature noise, even when the detector operates at room temperature. This much higher thermal signal to thermal noise ratio is then converted into a much higher electrical signal to electrical noise by the thermal sensor element.

There is thus provided in accordance with the invention, a terahertz (THz) detector assembly comprising a first dielectric substrate, an antenna fabricated on the first substrate, the antenna including a first capacitive plate portion, a plurality of nano-tip spacers fabricated on the antenna, a second dielectric substrate, a sensor constructed on the second dielectric substrate and including a second capacitive plate portion, the sensor operative to sense THz energy received by the antenna array and transferred to the sensor via capacitive coupling and wherein the separation between the first capacitive plate portion and the second capacitive portion forming a capacitive coupling therebetween is created by the plurality of nano-tip spacers, the plurality of nano-tip spacers operative to provide thermal isolation between the antenna and the sensor.

There is also provided in accordance with the invention, a terahertz (THz) detector assembly comprising an antenna fabricated on a first dielectric substrate, a sensor constructed on a second dielectric substrate, the sensor operative to sense THz energy received by the antenna array and a plurality of electrically conductive nano-tip spacers operative to electrically couple the antenna and the sensor.

There is further provided in accordance with the invention, a terahertz (THz) detector assembly comprising a first dielectric substrate, an antenna array fabricated on the first substrate, the antenna array including a first capacitive plate portion, a second dielectric substrate, a sensor array constructed on the second dielectric substrate, the sensor array comprising a suspended platform including a second capacitive plate portion and a thermal sensor, the sensor array operative to transfer THz energy received by the antenna array to an electrical load via capacitive coupling and to convert the heat generated by the load to an electrical signal and a plurality of nano-tip spacers sandwiched between the antenna array and the sensor array and operative to both determine the gap between the first capacitive plate portion and the second capacitive plate portion and to provide thermal isolation between the antenna array and the sensor array.

There is also provided in accordance with the invention, a terahertz (THz) detector assembly comprising a first dielectric substrate, an antenna array fabricated on the first substrate, the antenna array including a first capacitive plate, a plurality of nano-tip spacers, a second dielectric substrate, a sensor array constructed on the second dielectric substrate, the sensor array comprising a suspended platform including a second capacitive plate, a thermal sensor and an electrical load coupled to the second capacitive plate, the suspended platform suspended by one or more holding arms connected to the second dielectric substrate, wherein a coupling capacitor is formed by vertically joining the antenna array to the sensor array such that the first capacitive plate and the second capacitance plate are separated by a gap whose distance is determined by the plurality of nano-tip spacers and wherein the sensor array is operative to transfer THz energy received by the antenna array to the electrical load via the coupling capacitor and to convert the heat generated by the electrical load to an electrical signal, wherein the capacitive coupling provides thermal isolation between the antenna array and the sensor array.

BRIEF DESCRIPTION OF THE DRAWINGS

The invention is herein described, by way of example only, with reference to the accompanying drawings, wherein.

DETAILED DESCRIPTION OF THE INVENTION

THz radiation imaging is currently a fast developing research area with inherent applications such as THz security imaging which can reveal weapons hidden behind clothing from distances of ten meters or more; or medical THz imaging which can reveal, for example, skin cancer tumors hidden behind the skin and perform fully safe dental imaging. Constructing prior art THz detectors is typically a challenging endeavor since both radiation sources and radiation detectors are complex, difficult and expensive to make.

THz radiation is non-ionizing and is therefore fully safe to humans unlike X-ray radiation. THz imaging for security applications, for example, uses passive imaging technology, namely the capabilities of remote THz imaging without using any THz radiation source thus relying solely on the very low power natural THz radiation which is normally emitted from any room temperature body according to well-known black body radiation physics. Passive THz imaging requires extremely sensitive sensors for remote imaging of this very low power radiation. Prior art passive THz imaging utilizes a hybrid technology of superconductor single detectors cooled to a temperature of about 4 degrees Kelvin which leads to extremely complex (e.g., only the tuning of the temperature takes more than 12 hours before any imaging can take place) and expensive (e.g., $100,000 or more) systems. A detector is desirable that can be used to detect THz radiation and that has much lower potential cost compared with existing superconducting solutions. Passive THz imaging, however, requires three orders of magnitude higher sensitivity compared with passive infrared (IR) imaging, which is a challenging gap.

In addition, the need to cool the detector to cryogenic temperatures for reducing noise in prior art detectors is significant drawback for an imager, which would find its natural field of application in surveillance and inspection activities. Such a cooling apparatus would raise the cost of the system considerably and would make power consumption much larger, limiting its mobility. An active THz system can operate with less sensitive pixels since it relies on reflections of the radiation emitted by a source, embedded in the system; the radiation provided by the source is typically larger than that spontaneously emitted by the target.

Further, processing the signal obtained from active imaging can be complicated because of the possible reflections, interfering with the original light distribution. Passive imaging has the further advantages of allowing covert monitoring and of eliminating any reason of health-related concerns of the public. Solutions offering imaging capabilities at lower frequencies suffer from a limited spatial resolution and scarce compactness. The low-cost aspect is also emphasized since the many potential applications for THz cameras, combined with their availability, would make them a potential object of large scale commercialization.

THz antennas with capacitive coupling provide a challenge to the designer for achieving both high sensitivity (for enabling passive imaging) and fast response time (allowing video frame rates). The efficiency with which the signal is transferred to the thermal sensor strongly depends on the capacitor size. A large parallel plate capacitor is obtained when the plates have a large area and when the gap between them is small. Due to sensitivity requirements, the thermal resistance $R_{th}$ of the thermal sensor must be large (we want $\Delta T_{ss}=P_{opt} \cdot R_{th}$ to be large); but at the same time we need the time constant $\tau=R_{th}C_{th}$ to be small. A small thermal capacitance is obtained when the mass and specific heat of the sensor are small. Hence we can only increase the capacitor area at the expense of the pixel's response time. On the other hand we are limited in scaling the gap size due to the deformation of the suspended structure that follows MEMS post-processing due to the release of residual stress and causes large tolerances; in addition tilting and deformation reduce the nominal capacitance to even smaller values.

In one embodiment, the detector consists of a hybrid focal plane array (FPA) for uncooled passive THz imaging that is obtained, in one embodiment, with the use of a CMOS-SOI chip, etched using MEMS processes, and an array of THz antennas electrically coupled to the thermal sensors on the chip. The CMOS-SOI process layers are used both for making the devices (e.g., transistors or diodes working as thermal sensors) and the masks for the subsequent post-processing. The thermal sensors can be made of silicon dioxide platforms, suspended by one or more holding arms, after being thermally isolated with a MEMS process. The sensor is separated from the antenna by one or more nano-tip spacers which determine the gap distance between them.

In one embodiment, the signal from the antenna is coupled through an air-gap which separates the plates of a parallel plate capacitor. This large capacitor is built on the surfaces of the antenna and the sensor that face each other. Several well-known processing techniques can be used for achieving these structures. The solutions currently available however are flawed by the geometrical tolerances of the micromachining process. A good capacitive coupling is obtained when the coupling impedance, $|Zc|=1/\omega C$, is much smaller than the load (and antenna) resistance. The capacitance is given by $C = \in_{gap} * Area/t_{gap}$, where $\in_{gap}$ is the permittivity of the material in the gap (vacuum or air). Gaps of the order of 1 μm are commonly used, requiring very large capacitor plate areas for achieving the targeted capacitance value. Moreover, the need for higher thermal isolation, compared to sensors used for FIR, requires longer and thinner MEMS structures, eventually causing the tolerances to worsen. Large discrepancies between pixels are to be expected if the gap control issue is not addressed.

In one embodiment, a method for controlling the gap is based on electro-static actuation. By placing one or more pairs of electrodes, and by adding a circuit for current-controlled actuation, a very large range of travel (up to the whole gap) can be obtained for tuning $t_{gap}$.

Fabricating the regular (i.e. fixed gap) capacitive coupling described above, however, is challenging for the new generation of high sensitivity bolometers for THz radiation. The reason lies in the conflicting need for geometrically small capacitors having large capacitances. Thermal sensors designed for passive imaging at long wavelengths, because of the very weak signals involved, must be extremely sensitive. This is achieved by choosing a very large thermal resistance. Since video rates are desirable for the pixels, however, a very tiny sensor size is required in order to keep the response time $\tau_{th} = R_{th} C_{th}$ sufficiently low. A large electrical capacitance density can be obtained for a given tolerable area if the distance between the plates $t_{gap}$ is small. Controlling the gap's width with high precision is therefore essential for defining the coupling capacitance. This is challenging because of the tolerances resulting from deformations that follow the MEMS process, which is used for fabricating the sensors.

In the embodiment utilizing electrostatic actuation, achieving both large capacitance and small area is theoretically possible, thus allowing the implementation of practical and fast pixels. Since this solution requires additional design effort for biasing the actuator and for calibrating the initial state, however, it is advantageous to adopt it when the advanced operations that it allows (reset, CDS, AM) are also needed.

In another embodiment, a physical stopper for contacting the antennas with the sensors is created while preserving the thermal isolation between them. Hence, by fabricating tips of nanometer scale (referred to as nano-tips or nano-tip spacers) on top of one capacitor plate and by subsequently moving this plate to make contact with the other one (up to the distance provided by the tip), a spacer for precise gap control is achieved. The tips are fabricated such that the thermal conductance between the capacitor plates through tips is minimized. To achieve this a combination of (1) a low thermal conductance material for the tip body, (2) a small cross-section of the tip-surface contact in the nanometer range, and (3) a high thermal resistance across the boundary between different materials (tip and capacitor surface), is used.

Figure 1:
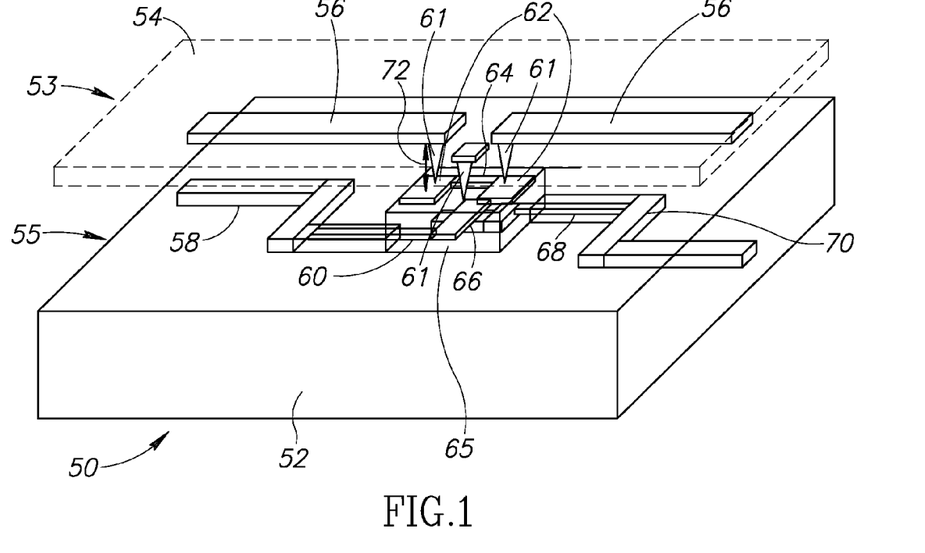
FIG. 1 is a diagram illustrating an example embodiment of a passive THz radiation detector incorporating vertical antenna coupling to the sensor platform.

A diagram illustrating an example embodiment of a passive THz radiation detector incorporating vertical antenna coupling to the sensor platform is shown in FIG. 1. The detector, generally referenced 50, comprises a vertical antenna array 53 aligned over a thermal sensor 55 separated by one or more nano-tip spacers 61 (e.g., three spacers in the example embodiment shown). The vertical antenna array 53 comprises a dielectric substrate 54 and antennas 56. The dielectric substrate is preferably transparent to THz radiation. The thermal sensor 55 comprises a dielectric substrate 52, suspended platform 65, holding arms 58, 70, wires 60, 68, capacitive plates 62, electrical load resistor 64 and thermal sensing transistor 66.

As shown in FIG. 1, the length of the nano-tip spacers equals the clearance between the capacitor plates. This length is chosen to find an optimum balance between the good capacitive coupling between the plates and the increasing thermal conductance via radiation across the air/vacuum gap between the plates.

Figure 2:
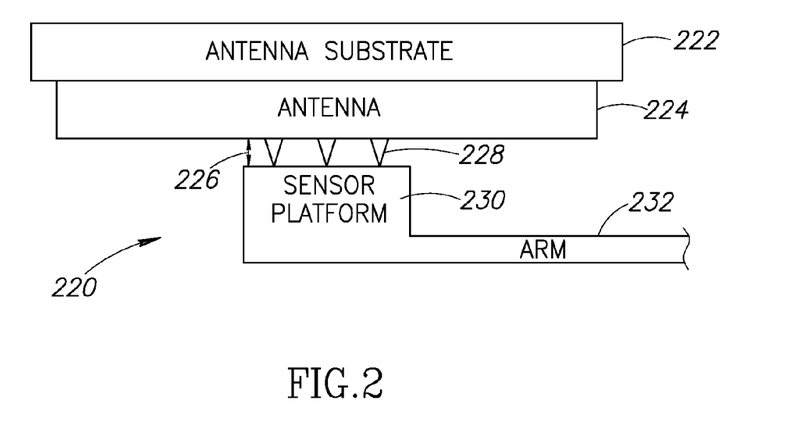
FIG. 2 is a diagram illustrating a side view of a single detector assembly after the antenna is vertically joined to the sensor platform.

A diagram illustrating a side view of the detector assembly after the antenna is vertically joined to the sensor platform is shown in FIG. 2. The detector, generally referenced 220, comprises a first dielectric substrate 222 on which an antenna array structure 224 and one or more nano-tip spacers 228 are fabricated. A sensor array structure is formed on a second dielectric substrate 230. The suspended sensor platform comprises a holding arm 232 and comprises capacitive plates, electrical load, thermal sensor (transistor) and RF choke (not shown). The nano-tip spacers 228 set the gap distance 226 between the antenna and sensor.

The detector assembly is formed by joining the two components, namely the antenna array and sensor array wherein a gap 226 is formed between the two components. The antenna array is placed vertically over the sensor array such that the nano-tip spacers contact the sensor platform thereby aligning and setting the gap between the capacitive plates on the antenna array with the capacitive plates on the sensor array. Note that in one embodiment, the detector assembly is packaged under vacuum in order to improve the thermal isolation of the sensors.

Figure 9:
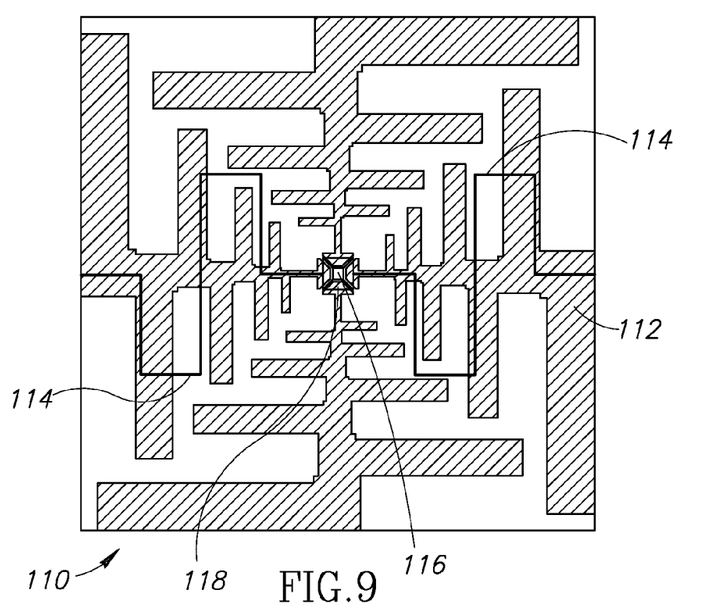
FIG. 9 is a diagram illustrating a top plan view of a pixel after the detector is assembled.

In one embodiment, the antennas are constructed of a metallic material deposited on a dielectric substrate 222, transparent to the desired wavelengths. The specific antenna design can be chosen according to the particular frequency and bandwidth requirements, and is not constrained by the adoption of the solution described in this invention. For example, a log-toothed antenna for the 0.5-1.5 THz range is shown in FIG. 9.

Other possible antenna types include spiral antennas, toothed antennas and slotted antennas. Although it is not critical which antenna type is used, it is preferred that the energy from the antenna is not directly coupled to the detector but rather is capacitive coupled to permit thermal isolation of the thermal sensor element.

The thermal sensors are constructed of devices whose electrical current is strongly dependent upon their temperature. When the radiation detected by the antenna is transferred to the platform hosting the device in the form of an induced current, the sensor heats up and detects the signal. In order to couple between the antenna and the load located on the platform, a plurality of capacitors is used (e.g., four).

Figure 3:
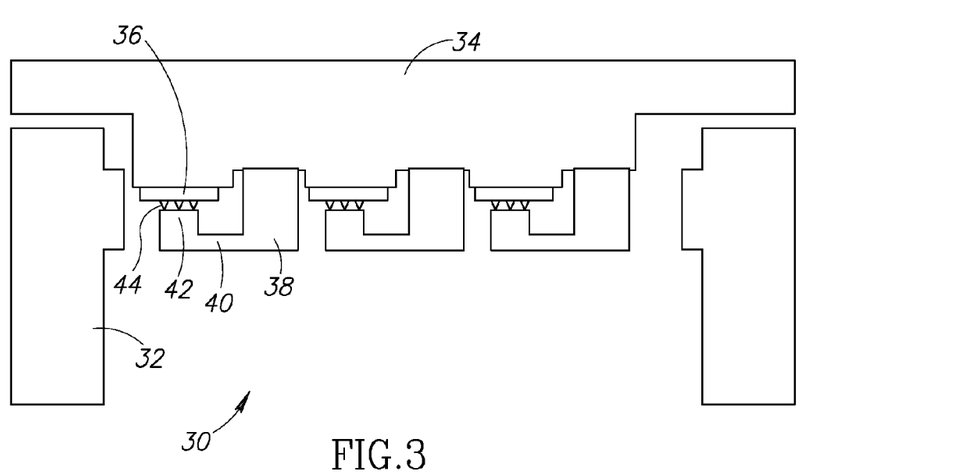
FIG. 3 is a diagram illustrating a side view of an array detector assembly after the antenna is vertically joined to the sensor platform.

A diagram illustrating a side view of the detector assembly after the antenna is vertically joined to the sensor platform is shown in FIG. 3. The detector, generally referenced 30, comprises a first dielectric substrate 34 on which an antenna array structure 36 and a plurality of nano-tip spacers 44 are formed. A sensor array structure is formed on a second dielectric substrate 32 (CMOS substrate). The sensor array comprises a frame 38, one or more holding arms 40 and a suspended platform 42. The suspended platform comprises capacitive plates, electrical load, thermal sensor (transistor) and RF choke.

The detector assembly is formed by vertically joining the antenna array and sensor array wherein a gap 44 is formed between the two components which are separated by the height of the nano-tip spacers. The gap is formed by the nano-tip spacers between a portion of the antenna that functions as capacitive plates and the capacitive plates in the sensor array to form a coupling capacitor. The antenna array is placed vertically over the sensor array such that the capacitive plates on the antenna array align with the capacitive plates on the sensor array leaving a suitable gap distance 44.

In one embodiment, the invention applies to a structure composed of an antenna array, deposited on a substrate providing mechanical strength, and a thermal sensor array, comprising temperature sensing elements such as bolometers or diodes. The invention comprises fabricating (e.g., growing) a small number of tips (e.g., three) on the surface of each element of either the antenna array or the sensor array before these two elements are assembled together.

After the nano-tips are formed, the two parts are combined by pushing the antennas' supporting substrate until contact is made with the thermal sensor surface. A precise lateral alignment between them is required in order to have the two plates facing each other and exact area overlap.

In one embodiment, the nano-tips are constructed from silicon nitride. This material can be fabricated into tip-shape by molding, etching or other well-known semiconductor processes. Silicon nitride has a low thermal conductivity (~10 W/K/m), is electrically insulating and mechanically robust. In one embodiment, the nano-tips are constructed from silicon. It can be fabricated into tip-shape using anisotropic etching, thermal oxidation or other well-known semiconductor processes. The thermal conductivity is relatively low (~100 W/K/m), the electrical conductivity can be controlled with doping and eliminated using a thin insulator layer. Alternatively, another material that can be used to fabricate the nano-tips is silicon oxide which exhibits extremely low thermal conductance (~1.4 W/K/m). It can be fabricated into tip-shape using etching processes. Note that other materials for the nano-tips can be chosen from diamond, amorphous carbon, aluminum oxide and silicon carbide. The choice of material depends on the particular implementation.

Several parameters of the material that should be taken into consideration include its mechanical strength, compliance to the processing method of the nano-tips, possible integration into the device, thermal and electrical conductivities of the nano-tips and the magnitude of near-field thermal radiation for the given material.

In one embodiment, the nano-tips are both thermally and electrically insulating the antenna from the sensor. The electromagnetic signal originated by the incident radiation is collected by the antenna and transferred to the electrical load via the gap by capacitive coupling. The antenna load is located next to the thermal sensor; this load heats up due to Joule heating when a RF signal induces RF current inside it. Finally, the heat spreads to the thermal sensor positioned nearby.

Figure 4:
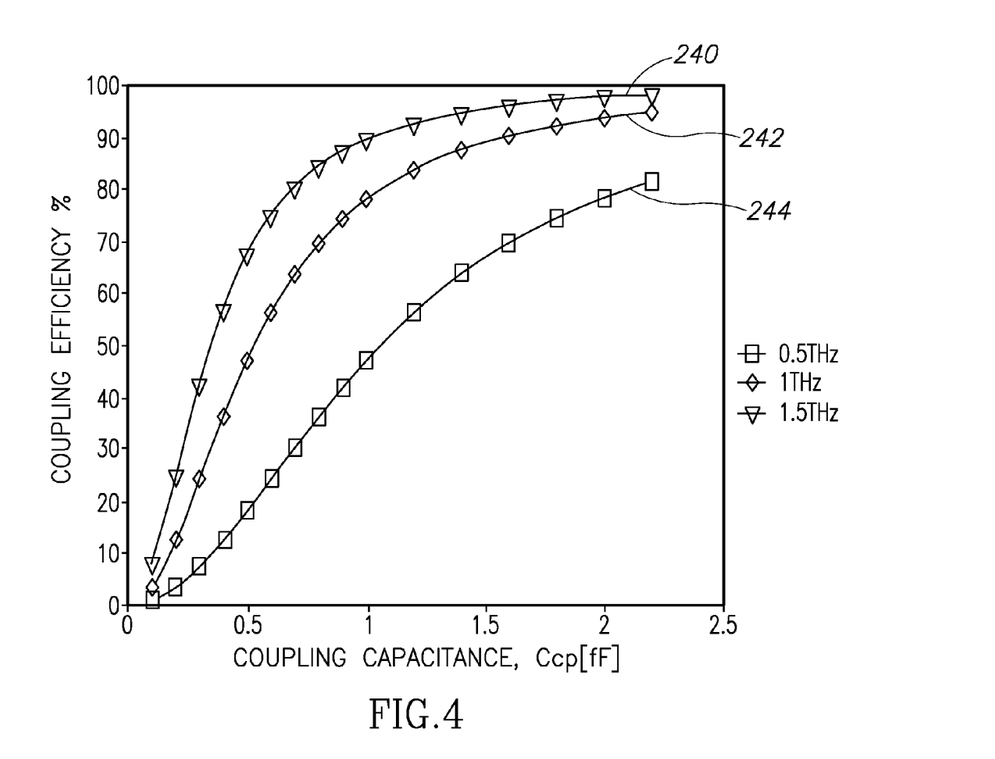
FIG. 4 is a graph illustrating the coupling efficiency as a function of coupling capacitance and frequency.
Figure 5:
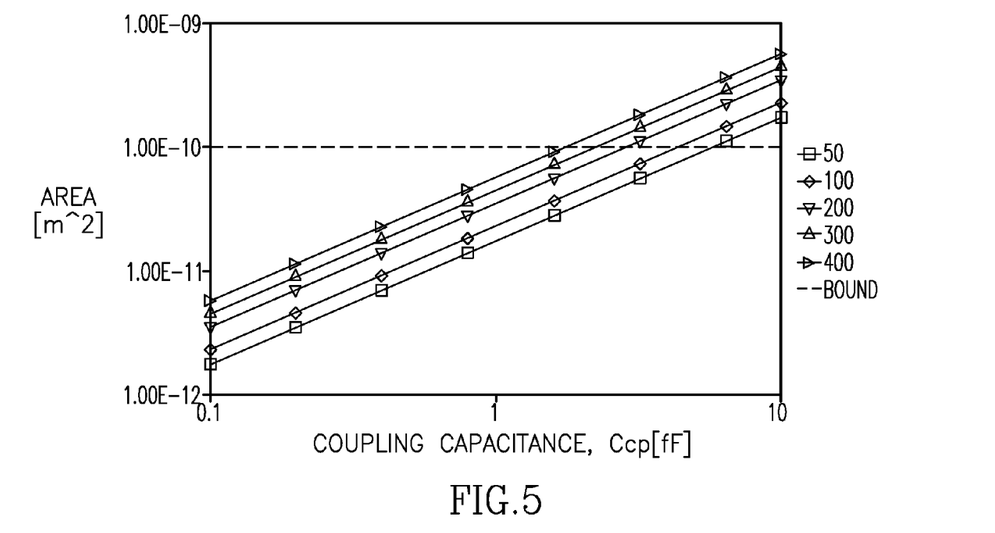
FIG. 5 is a graph illustrating the overlap area as a function of gap size and coupling capacitance.

If the impedance of the coupling capacitor is non-negligible, then part of the energy provided by the signal (namely, by the incident radiation) will not be transferred to the load and, therefore, will be lost. The degradation of the transduction efficiency eventually translates to a loss of sensitivity to small THz signals. The impedance of the capacitor $Z_c = 1/j\omega C$ is frequency dependent, while the worst case to be handled is the lower frequency edge (yielding larger $Z_c$). FIG. 4 illustrates the coupling efficiency as a function of capacitance, with three typical frequencies as parameters (0.5 THz as trace 244, 1.0 THz as trace 242, 1.5 THz as trace 240). Note that a relatively high capacitance (e.g., 1 fF) is necessary in order to achieve a sufficient coupling efficiency. The tradeoff of coupling efficiency and capacitance is the large platform area required which is shown in the graph of FIG. 5, for several different gap sizes (400 nm in trace 250, 300 nm in trace 252, 200 nm in trace 254, 100 nm in trace 256, 50 nm in trace 258).

The coupling efficiency can be modeled as follows. An AC voltage source provides a small signal V generated at the antenna terminals. The antenna exhibits an electrical impedance $Z_{ant} = R_{ant} + jX_{ant}$ (note that for simplicity, we neglect the imaginary part). Two series coupling capacitors $C_{cp}$ connect the load impedance $R_L$ to the source. The load heats up according to the power dissipated over it. Hence, the coupling efficiency can be defined as the ratio of the available power to the power actually delivered to the load in the presence of the coupling capacitors.

$$P_{available} = \frac{V^2}{4R_L} \tag{1}$$

$$P_{load} = \frac{V^2 R_L}{(R_{ant} + R_L + 2/sC_{op})^2}$$

Assuming a perfect impedance matching, we have $R_L = R_{ant}$. Thus, efficiency $\eta$ can be expressed as $$\text{Efficiency } \eta \equiv \frac{|P_{load}|}{P_{available}} = \frac{R_{ant}^2}{|R_{ant} - j/\omega C_{op}|^2} \tag{2}$$

Depending on the lowest frequency sensed by the antenna, an accordingly large electrical capacitance will be required in order to achieve the target coupling efficiency. In order to obtain a large parallel plate capacitance within a small area, a very small gap should be left between the two plates. This gap can be controlled with spacers comprising from nano-scale tips that can be deposited on one of the electrodes before the two parts are assembled.

In one embodiment, an optimal number of tips is three, but more or fewer than three may be used as well. Less than three may possibly undermine the fabrication yield and increase the importance of tolerances of the height. Using more than three tips may possibly result in some of them not touching the opposite surface and it would degrade the thermal isolation.

In an alternative embodiment, the nano-tip spacers are used for direct electrical coupling of the antenna and the thermal sensors by using the tips as electrical conductors (but also as thermal insulators) thus avoiding capacitive coupling completely. Since thermal and electrical conductivity are tightly connected (in particular at nano-scale), this will result both in a parasitic resistance seen by the RF signal and in a compromise in thermal resistivity, resulting in lower temperature sensitivity. The advantage is to relax the requirements on the tip size, resulting in more controllable and uniform features. Electrically conductive tips can be obtained by building isolating tips as in the original embodiment and then adding a conductive layer by silicidation (PtSi).

In this case the efficiency $\eta$ can be written as:

$$\eta \equiv \frac{V^2 R_L}{(R_{ant} + R_L + 2R_{tip}/n)^2} \bigg/ \left(\frac{V^2}{4R_L}\right) = \tag{3}$$

$$\frac{R_L^2}{(R_{ant} + R_{tip}/n)^2} = \frac{1}{\left(1 + \frac{1}{n}\frac{R_{tip}}{R_{ant}}\right)^2}$$

where n is related to the number of tips (assuming that two tips or two arrays of them are always used as contacts along the electrical path of the signal towards the load).

From Equation 3 above we can set the following condition:

$$\Rightarrow R_{tip} \leq \left(\frac{1}{\sqrt{\eta}} - 1\right) nR_{ant} \quad (4)$$

For example, a target efficiency of 85% can be achieved for n=1 and $R_{ant}$=50Ω when $R_{tip}$<4.2Ω.

Figure 6:
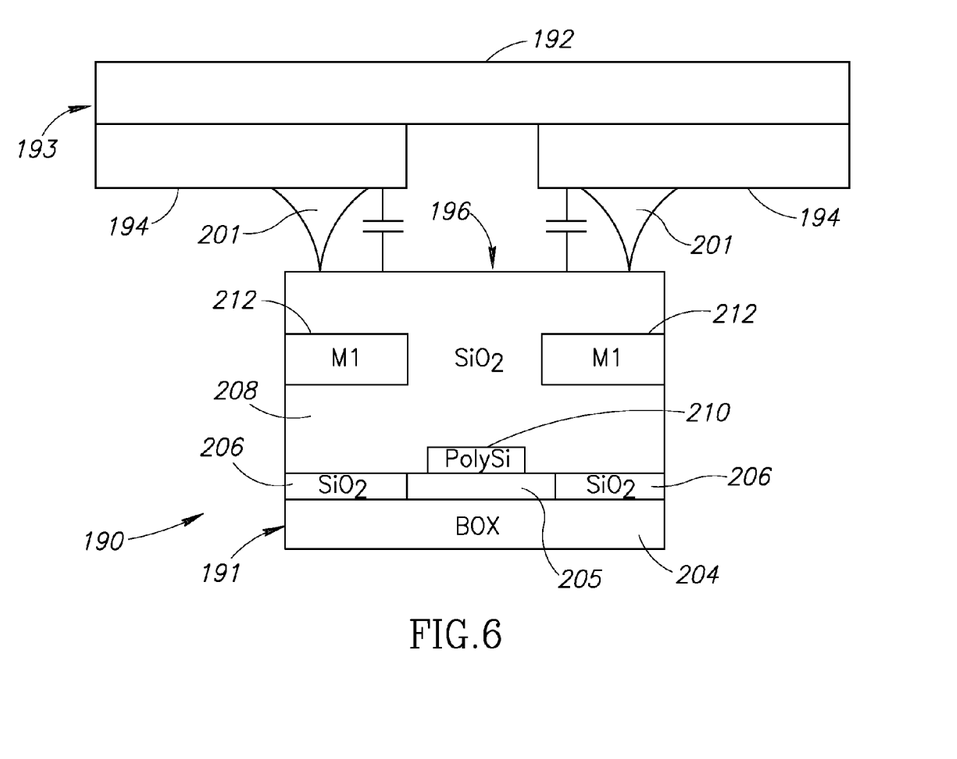
FIG. 6 is a diagram illustrating a cross sectional view of the vertical antenna and sensor platform.

A diagram illustrating a cross sectional view of the vertical antenna and sensor platform is shown in FIG. 6. The detector, generally referenced 190, comprises a vertical antenna array 192 and a sensor platform 191 spaced apart via a plurality of nano-tip spacers 201. The antenna array 192 comprises a substrate 193 and antenna 194. The sensor platform 191 comprises BOX layer 204, active silicon layers 205, silicon dioxide layers 206, polysilicon portion 210 (thermal sensor) and metal portion M1 212 (capacitive plates).

The THz detector utilizes an electromagnetic coupling technique whereby the optical energy (i.e. THz energy) is first absorbed by the antenna which functions to convert it to electrical energy that is then capacitively coupled to the thermally isolated, released thermal sensor element (e.g., a diode, transistor, etc.). Capacitively coupling the antenna to the thermal sensor element provides thermal isolation of the sensor from the antenna.

Figure 12:
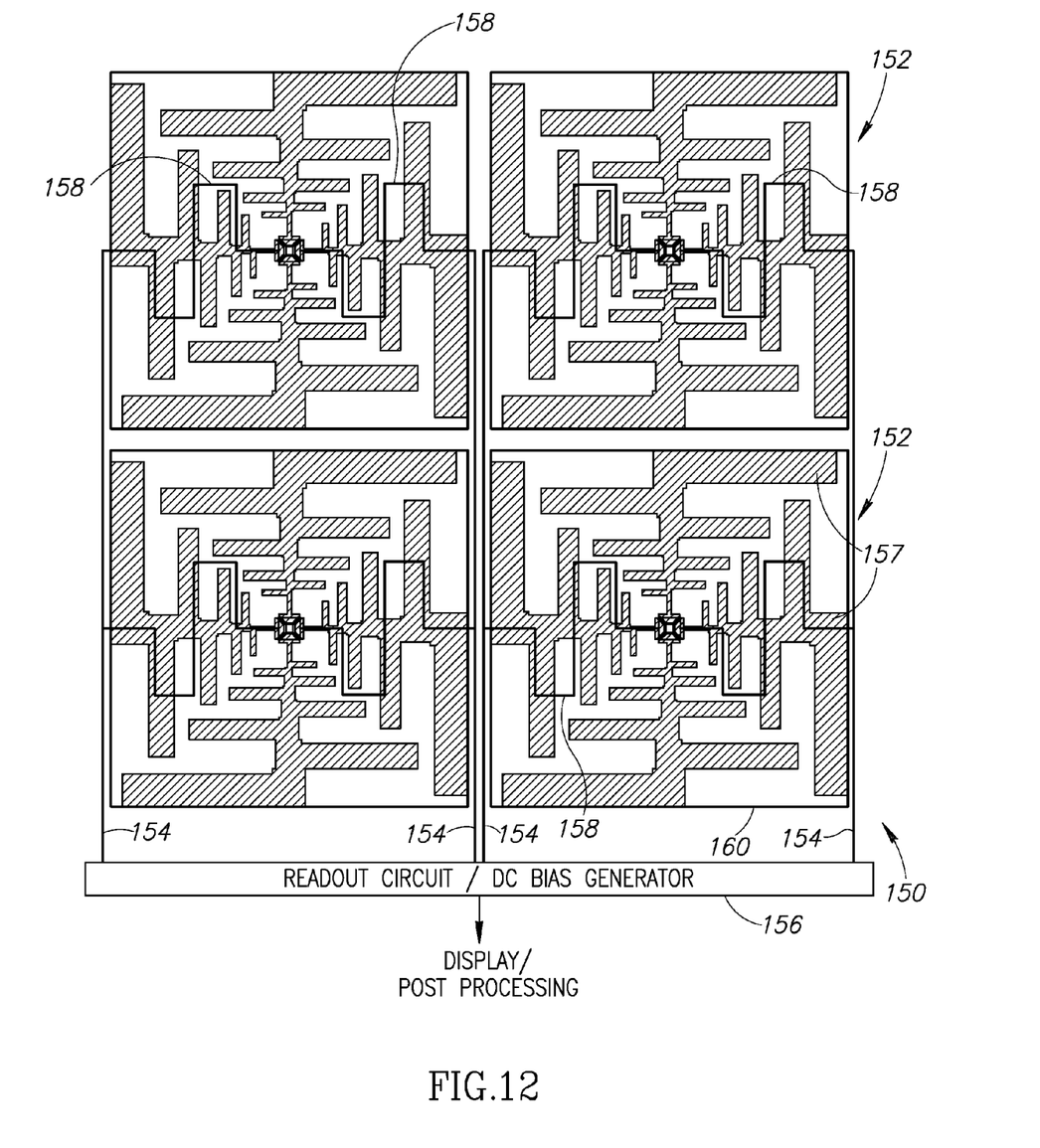
FIG. 12 is a diagram illustrating an example 2×2 pixel matrix using the THz radiation detector of FIG. 9.

In one example embodiment, a plurality of detectors are arranged to receive THz radiation energy in a 2D array configuration, as shown in FIG. 12. In this case, THz radiation energy received in each pixel of the 2D imaging array, whose size, in one example embodiment, is on the order of several hundred microns (e.g., 300 microns square) and concentrated at each pixel at a frequency on the order of 1 THz into a much smaller suspended MEMS platform (of the order of tens microns) on which the THz detector is situated (so that the complete suspended thermally isolated MEMS structure has minimal thermal mass and thermal conductivity). As mentioned hereinabove, this is achieved by means of converting the THz photon energy into electrical energy using a pixilated antenna and by using capacitive coupling to couple this focused antenna energy across the thermally isolated air gap and into the suspended platform on which the thermal sensor is located. This method achieves focused THz induced thermal heating of the suspended platform so that this THz induced thermal signal becomes much stronger than the detector temperature noise, even when the detector operates at room temperature. This higher thermal signal to thermal noise is then converted into a signal having a larger electrical signal to noise ratio by the sensing active device (e.g., transistor). In other words, a thermal conductance discontinuity (e.g., capacitance coupling gap) is created between the antenna and the relatively small suspended platform by means of the MEMS process.

The technique of using capacitive coupling to focus the antenna energy onto an isolated sub-pixel floating platform can be used with a variety of on-chip pixilated antennas, such as the antenna shown in FIG. 9. Focusing the THz energy via the antenna aids in filtering out competing received infrared radiation, since the infrared radiation will not be received by the antenna.

In addition, the detector provides impedance matching between the pixilated antenna and the thermal sensor across the coupling capacitance. An antenna with reactive impedance is preferably used that cancels the coupling capacitance at the bandwidth of interest. This can be achieved, for example, by using a bow-tie dipole antenna whose length is larger than half a wavelength and is also possible by an appropriate design of the antenna. The higher than half wavelength antenna also provides a high impedance of several hundred ohms which aids in matching the antenna to the thermal sensor element across the given impedance of the coupling capacitor.

Note that in one embodiment, a cross shaped resistor made of polysilicon is mated with a standard NMOS transistor located in the vicinity of the resistor. Note that in an alternative embodiment, this approach is modified to permit separating the two different polarizations of the received THz radiation. This can be useful to identify polarized radiation such as obtained from reflection by flat surfaces.

Figure 7:
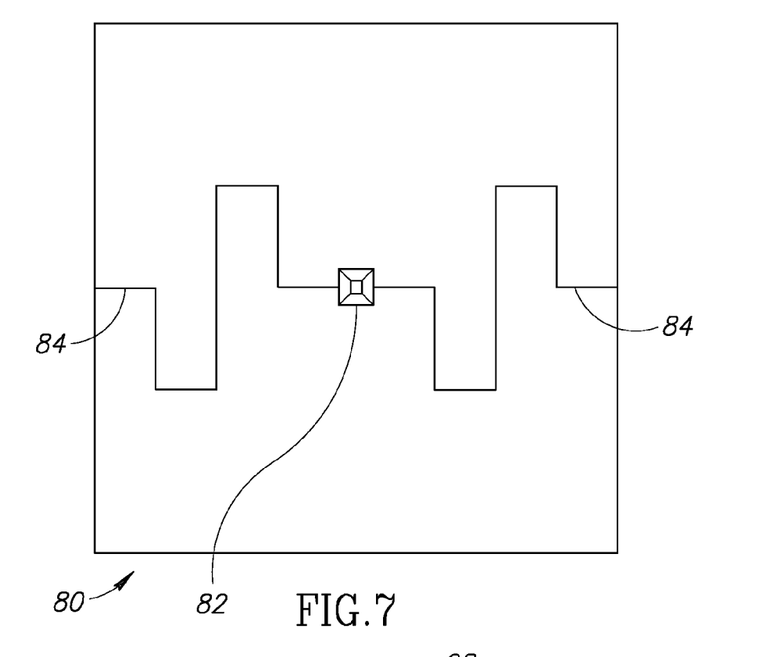
FIG. 7 is a diagram illustrating a top plan view of the suspended platform and holding arms of a pixel before the detector is assembled.

A diagram illustrating a top plan view of the suspended platform and holding arms of a pixel before the detector is assembled is shown in FIG. 7. In one embodiment, the detector, generally referenced 80, comprises a sensor array platform 82 suspended via holding arms 84. The sensor array comprises capacitive plates, electrical load and thermal sensor. Note that the antenna structure is not shown to aid in illustrating the configuration of the holding arms and sensor platform. It is appreciated that a number of holding arms other than two may be used depending on the particular implementation.

Figure 8:
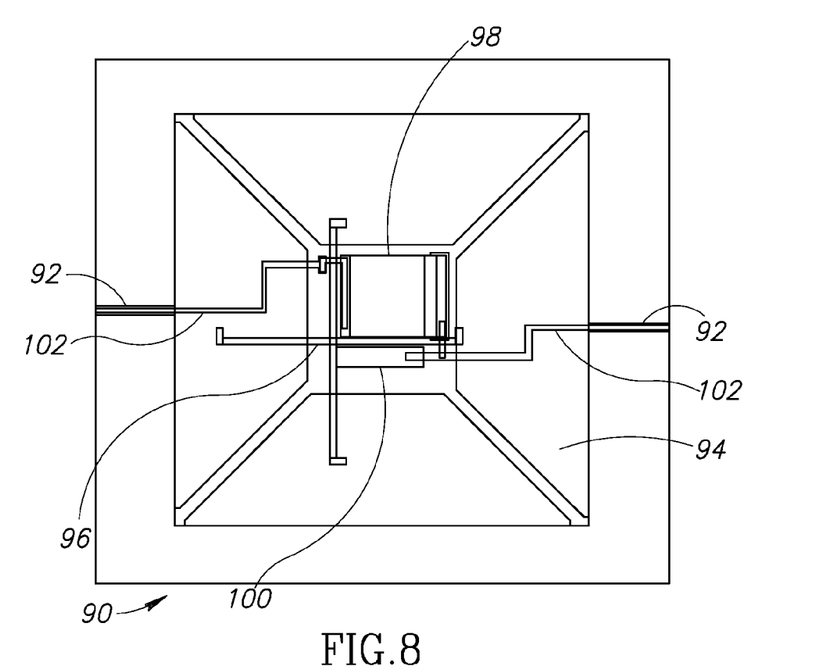
FIG. 8 is a diagram illustrating a top plan view of the suspended platform in more detail before the detector is assembled.

A diagram illustrating a top plan view of the suspended platform in more detail before the detector is assembled is shown in FIG. 8. In one embodiment, the detector, generally referenced 100, comprises a plurality of capacitive plates 94 (e.g., four), holding arms 92, wires 102, electrical load resistor 96, thermal sensor (transistor) 98 and RF choke 100.

Note that the antenna structure is not shown to aid in illustrating the configuration of the holding arms and sensor platform. The electrical load 96 is connected to all four capacitive plates 94. Energy focused by the antenna is capacitive coupled to the electrical load which heats up as a response. The heat is sensed by the thermal sensor 98 and converted to an electrical signal.

A diagram illustrating a top plan view of a pixel after the detector is assembled is shown in FIG. 9. The detector, generally referenced 110, comprises antenna array 112, holding arms 114 sensor platform 118 and coupling capacitors 116.

Figure 10:
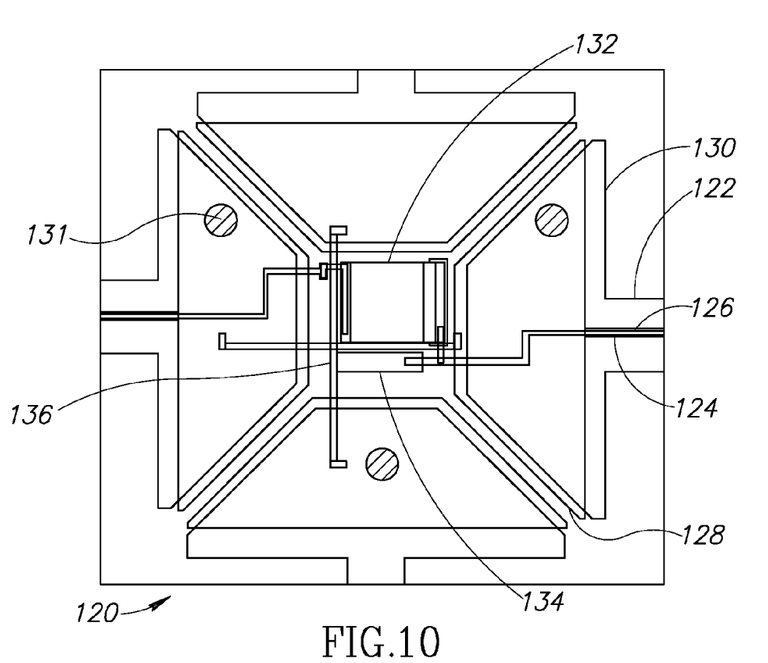
FIG. 10 is a diagram illustrating a top plan view of the suspended platform in more detail before the detector is assembled.

A diagram illustrating a top plan view of the suspended platform in more detail before the detector is assembled is shown in FIG. 10. The detector, generally referenced 120, comprises antenna elements 122, holding arms 124, wires 126, four lower capacitive plates 128 (on sensor suspended platform), four upper capacitive plates 130 (on vertical antenna), a plurality of nano-tip spacers 131, electrical load 136, RF choke 134 and thermal sensor 132.

In one embodiment, since blackbody emission is randomly polarized, a set of two orthogonal antennas can be used to increase the absorption efficiency. Each group of terminals is terminated by a load, whose resistance is matched to the radiation resistance of the antenna. A plurality (e.g., four) of capacitors is formed in the overlap area of the terminal lobes of the four antennas and the first metallization layer (M1) of the underlying platform. The gap between these electrodes is preferably relatively small in order to yield a large capacitance, which in turn is desirable in achieving high coupling efficiency. The electromagnetic energy carried by the THz radiation is thus transferred to the matched polysilicon loads located on the platform.

Figure 11:
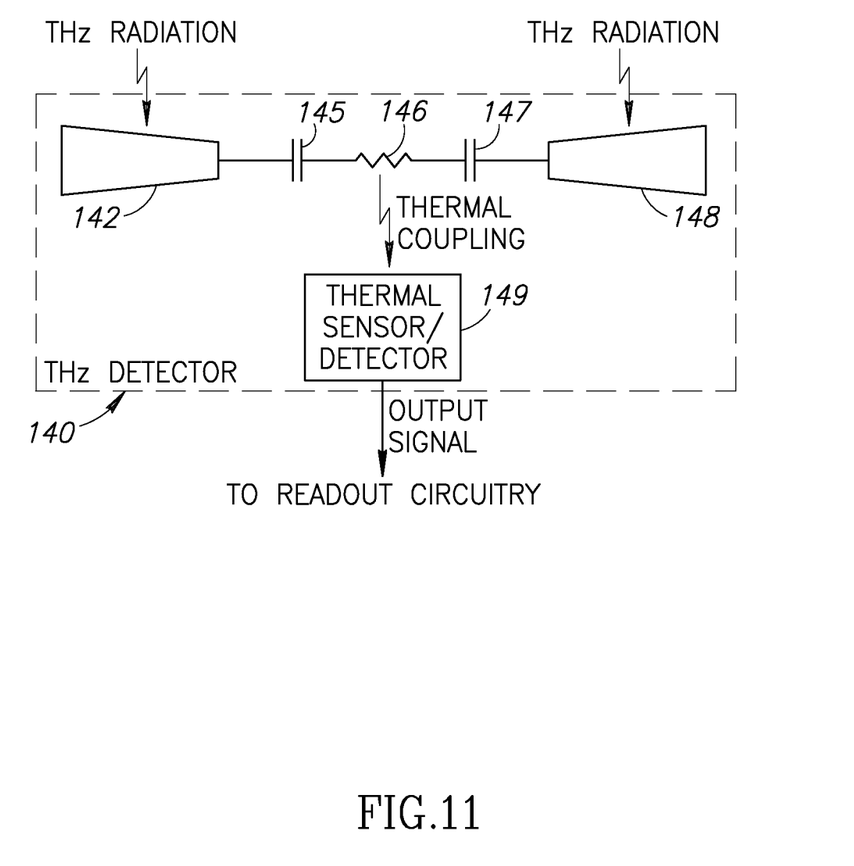
FIG. 11 is a diagram illustrating the electrical and thermal coupling in the detector.

A circuit diagram illustrating an equivalent circuit for the THz radiation detector of FIG. 1 is shown in FIG. 11. The detector, generally referenced 140, comprises a plurality of antennas elements 142, coupling capacitors 145, electrical load (heating element, e.g., resistor) 146 and thermal sensor 149 thermally coupled to resistor 146.

A diagram illustrating an illustrative example of a small 2×2 pixel imaging matrix using the THz radiation detector of FIG. 9 is shown in FIG. 12. Note that using the techniques described herein, one skilled in the art can construct much larger matrices of several hundred pixels to create the required high resolution image. The imaging matrix, generally referenced 150, comprises a plurality of detectors 152 (four in this example embodiment), sensor signal lines 154 and read-out circuitry 156. Each detector comprises antenna arms 157, suspended platform 160, nano-tip spacers to set the gap between the capacitive plates and holding arms 158. The output of the sensors located on the platforms is input to the read-out circuit 156 for display or further post-processing. Note that in one embodiment, the pixel array is surrounded by dummy pixel rows and columns. Dummy rows and columns are used to keep the same MEMS and VLSI fabrication conditions for the pixels residing at the periphery of the two dimensional array.

To aid in understanding the operation of the THz detector of the present invention, an example calculation is provided to show quantitatively that room temperature passive THz imaging is a possibility at video rates utilizing the detector.

In this example, a predefined bandwidth of 0.5 to 1.5 THz is assumed, which contains black body power of I=2.857×10$^{-5}$ Watt/cm² at a temperature of 300 Kelvin. The corresponding black body power temperature sensitivity per degree Kelvin is given as $$dI/dT = 1.043 \times 10^{-7} \text{ Watt/cm}^2/°K \tag{5}$$

at T=300K when integrating from 0.5 to 1.5 THz. Let us assume that the overall radiation reception efficiency, considering atmospheric losses, lens losses, emissivity of the target less than one, pixel fill factor, efficiency of the antenna and impedance matching losses, etc. is given as $$\eta_{total} = \eta_{env} \times \eta 0.3 \tag{6}$$

where $\eta$ is the efficiency of the detector;

$\eta_{env}$ is the efficiency of the environment (i.e. anything other than the detector).

Note that the value of 0.3 is reasonable to assume at this stage. Let us assume that the pixel size is $A_D$=200×200 um² which is the wavelength at the higher end frequency of 1.5 THz and is therefore the best resolution limit which we can achieve at this frequency. Note that in the lower frequencies several pixels are used together to attain higher sensitivity of the unified larger pixel.

Let us assume a frame time of $\tau$=70 msec which corresponds to a video frame rate of 14 Hz, sufficient for the human eye. Higher frame rates are possible but they reduce the signal to noise ratio. Let us further assume that we are using a plastic THz lens with an $F_\#$=1 (i.e. the ratio of the focal length F to the lens diameter D). Alternatively, better optics may be used at the expense of large lens diameters or mirror combinations, etc. For this exemplary calculation, however, we assume simple feasible optics. Let us now assume a noise equivalent temperature difference (NETD) in the target of NETD=0.5° K which is sufficient for high quality thermal imaging.

Assuming the above stated values, the THz signal received by each pixel for a temperature change at the target of ΔT=NETD=0.5 Kelvin is Ps=NEP=1.56 picowatt. Note that this is the received power change per target 0.5 degree change, where the total target power received by each pixel, namely the background power, is approximately 8.57×10$^{-10}$ Watt. We calculate this using the well-known equation as follows $$Ps = \frac{dI}{dT} \times \Delta T \times A_D \times \frac{1}{4F_\#^2} \eta_{total} \tag{7}$$

where we replace $dI/dT \times \Delta T$ by the power density I for the calculation of the background power.

Let us now make the ideal assumption that the main detector noise is the fundamental thermal fluctuation noise due to the finite heat capacity of the platform. This is adequate for an initial start since the thermal fluctuation noise is always left even after we minimize the added electrical noises from the thermal sensor element itself. Assuming this, we can use the known relation for the Noise Equivalent Power (NEP) of the detector due only to the thermal fluctuation noise and equate it to the above calculated signal for reaching a unity signal to noise ratio as follows $$Ps = NEP \times \eta = \sqrt{\frac{kT^2 G_{th}}{\tau}} \tag{8}$$

Assuming that this same received power can be concentrated using capacitive coupling from the receiving antenna into the thermally isolated suspended platform, we obtain the desired threshold signal to noise of unity when the thermal conductivity of the platform is given by:

$$G_{th} = \frac{Ps^2 \tau}{kT^2} \tag{9}$$

which yields a required holding arm thermal conductivity of 1.243×10$^{-7}$ Watt/° K assuming a detector temperature of 315 degrees Kelvin (40 degrees Celsius). Note that better results are obtained when the detector is cooled somewhat and maintained, using a closed cycle system, at a fixed temperature somewhat lower than room temperature.

Using the material properties of an example 0.18 um SOI semiconductor process results in a thermal conductivity that corresponds to a suspended platform of 50 micron×50 micron and which has a thermal heat capacity of Cth=8.70×10$^{-9}$ Joule/Kelvin in the sense that they both provide the desired time constant of 70 milliseconds. Following the same calculation, focusing all the energy on a platform smaller than 50 micron by 50 micron, we obtain better performance than this (i.e. a lower NEP) limited by the ability to design and release a small platform, as well by the physical required size of the thermal sensor element (e.g., sensing transistor) which is located on this platform.

Let us now consider the electrical noise processes of the sensor element (e.g., sensing transistor). The expression for the NEP of the detector while also considering the added electrical noises is $$NEP \times \eta = \sqrt{\frac{kT^2 G_{th}}{\tau} + \frac{2qG_{th}^2 B}{TCC^2 I_D} + \frac{K_f G_{th}^2 \ln(f2/f1)}{TCC^2}} \tag{10}$$

These electrical noises, assuming that the transistor is at subthreshold, include two added terms to the NEP expression which are the fundamental shot noise (in the center) and the technology dependent 1/f noise (on the right). In order to lower the relative effect of shot noise we need a sufficiently large threshold detector current $I_D$, e.g., about several 100 nAs. In order to lower the 1/f noise a larger transistor is used which has a higher TCC for the same bias current, and also has a lower $K_f$. It also follows from Equation 6 that if we further reduce the holding arm thermal conductivity, we obtain a significant reduction in the relative impact of these added electrical noises. We can do so by targeting a much smaller platform than 50 micron×50 micron, which can be (in principle) as low as 10 micron×10 micron, thereby reducing the electrical noises by a factor of 625 and the thermal fluctuation noise by a factor of 25.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A terahertz (THz) detector assembly, comprising:
a first dielectric substrate;
an antenna fabricated on said first substrate, said antenna including a first capacitive plate portion;
a plurality of nano-tip spacers fabricated on said antenna;
a second dielectric substrate;
a sensor constructed on said second dielectric substrate and including a second capacitive plate portion, said sensor operative to sense THz energy received by an antenna array and transferred to said sensor via capacitive coupling; and
wherein the separation between said first capacitive plate portion and said second capacitive portion forming a capacitive coupling therebetween is created by said plurality of nano-tip spacers, said plurality of nano-tip spacers operative to provide thermal isolation between said antenna and said sensor.

2. The detector assembly according to claim 1, wherein the thermal conduction of said nano-tip spacers is less than 1E-7 Watts per Kelvin.

3. The detector assembly according to claim 1, further comprising a connection arm operative to connect said sensor to a third substrate, wherein the thermal conduction of said connection arm is determined by its length and is less than 1E-8 Watts per Kelvin.

4. The detector assembly according to claim 1, wherein said plurality of nano-tip spacers comprises at least three nano-tip spacers.

5. The detector assembly according to claim 1, wherein said plurality of nano-tip spacers is constructed from a material selected from the group consisting of Si, SiO2 and SiN.

6. The detector assembly according to claim 1, wherein said separation between said first capacitive plate portion and said second capacitive portion created by said plurality of nano-tip spacers is less than 500 nm.

7. A terahertz (THz) detector assembly, comprising:
an antenna fabricated on a first dielectric substrate;
a sensor constructed on a second dielectric substrate, said sensor operative to sense THz energy received by an antenna array; and
a plurality of electrically conductive nano-tip spacers operative to electrically couple said antenna and said sensor.

8. The detector assembly according to claim 7, wherein said nano-tip spacers minimize thermal conduction between said antenna and said sensor.

9. The detector assembly according to claim 7, wherein said nano-tip spacers have a thermal conduction less than 1E-7 Watts per Kelvin.

10. The detector assembly according to claim 7, wherein said plurality of nano-tip spacers comprises at least three nano-tip spacers.

11. The detector assembly according to claim 7, wherein said plurality of nano-tip spacers is constructed from a material selected from the group consisting of Si, SiO2 and SiN.

12. A terahertz (THz) detector assembly, comprising:
a first dielectric substrate;
an antenna array fabricated on said first substrate, said antenna array including a first capacitive plate portion;
a second dielectric substrate;
a sensor array constructed on said second dielectric substrate, said sensor array comprising a suspended platform including a second capacitive plate portion and a thermal sensor, said sensor array operative to transfer THz energy received by said antenna array to an electrical load via capacitive coupling and to convert the heat generated by said load to an electrical signal; and
a plurality of nano-tip spacers sandwiched between said antenna array and said sensor array and operative to both determine the gap between said first capacitive plate portion and said second capacitive plate portion and to provide thermal isolation between said antenna array and said sensor array.

13. The detector assembly according to claim 12, wherein said detector assembly is implemented by vertically joining said antenna array to said sensor array such that said plurality of nano-tip spacers contact said sensor array thus determining the gap between said antenna array and said sensor array.

14. The detector assembly according to claim 12, wherein current induced in said electrical load causes said thermal sensor to heat up and detect said THz received signal.

15. The detector assembly according to claim 12, wherein a plurality of capacitors is formed from joining said antenna array and said sensor array.

16. The detector assembly according to claim 12, wherein the height of said nano-tip spacers determines the capacitance realized by said first capacitive plate portion and said second capacitive plate portion.

17. The detector assembly according to claim 12, wherein said suspended platform is connected and secured to said second substrate via one or more holding arms.

18. A terahertz (THz) detector assembly, comprising:
a first dielectric substrate;
an antenna array fabricated on said first substrate, said antenna array including a first capacitive plate;
a plurality of nano-tip spacers;
a second dielectric substrate;
a sensor array constructed on said second dielectric substrate, said sensor array comprising a suspended platform including a second capacitive plate, a thermal sensor and an electrical load coupled to said second capacitive plate, said suspended platform suspended by one or more holding arms connected to said second dielectric substrate;

wherein a coupling capacitor is formed by vertically joining said antenna array to said sensor array such that said first capacitive plate and said second capacitance plate are separated by a gap whose distance is determined by said plurality of nano-tip spacers; and wherein said sensor array is operative to transfer THz energy received by said antenna array to said electrical load via said coupling capacitor and to convert the heat generated by said electrical load to an electrical signal, wherein said capacitive coupling provides thermal isolation between said antenna array and said sensor array.

19. The detector assembly according to claim 18, wherein the height of said nano-tip spacers determines the capacitance realized by said first capacitive plate and said second capacitive plate.

20. The detector assembly according to claim 18, wherein the thermal conduction of said nano-tip spacers is less than 1E-7 Watts per Kelvin.

21. The detector assembly according to claim 18, wherein the thermal conduction of said connection arm is determined by its length and is less than 1E-8 Watts per Kelvin.

22. The detector assembly according to claim 18, wherein said plurality of nano-tip spacers comprises at least three nano-tip spacers.

23. The detector assembly according to claim 18, wherein said plurality of nano-tip spacers is constructed from a material selected from the group consisting of Si, SiO2 and SiN.

24. The detector assembly according to claim 18, wherein said separation between said first capacitive plate portion and said second capacitive portion created by said plurality of nano-tip spacers is less than 500 nm.

* * * * *